(12) United States Patent
Paulus et al.

(10) Patent No.: US 7,622,802 B2
(45) Date of Patent: Nov. 24, 2009

(54) ELECTRONIC DEVICE WITH SEMICONDUCTOR CHIP INCLUDING A RADIOFREQUENCY POWER MODULE

(75) Inventors: Stefan Paulus, Zeitlarn (DE); Martin Petz, Hohenkammer (DE)

(73) Assignee: Infineon Technologies AG, Neubiberg (DE)

( * ) Notice: Subject to any disclaimer, the term of this patent is extended or adjusted under 35 U.S.C. 154(b) by 475 days.

(21) Appl. No.: 11/196,500

(22) Filed: Aug. 4, 2005

(65) Prior Publication Data

US 2006/0012032 A1 Jan. 19, 2006

Related U.S. Application Data

(63) Continuation of application No. PCT/DE2004/000185, filed on Feb. 4, 2004.

(30) Foreign Application Priority Data

Feb. 13, 2003 (DE) .................. 103 06 175

(51) Int. Cl.
*H01L 23/10* (2006.01)
*H01L 23/34* (2006.01)
(52) U.S. Cl. .................... 257/706
(58) Field of Classification Search ........... 257/276, 257/625, 675, 706, 707, 712–722, 796, E33.075, 257/E31.131, E23.051, E23.08–E23.113; 438/122
See application file for complete search history.

(56) References Cited

U.S. PATENT DOCUMENTS

| | | | | |
|---|---|---|---|---|
| 5,767,573 A | * | 6/1998 | Noda et al. ................. 257/675 |
| 5,905,301 A | * | 5/1999 | Ichikawa et al. ............ 257/676 |
| 5,920,119 A | | 7/1999 | Tamba et al. |
| 5,942,797 A | * | 8/1999 | Terasawa .................... 257/723 |
| 6,713,865 B2 | * | 3/2004 | Nomura ...................... 257/712 |
| 6,856,015 B1 | * | 2/2005 | Huang et al. ................ 257/706 |
| 2003/0011057 A1 | * | 1/2003 | Nakajima et al. ........... 257/678 |
| 2003/0040139 A1 | * | 2/2003 | Canella ...................... 438/117 |
| 2003/0062195 A1 | * | 4/2003 | Arrigotti et al. ............. 174/260 |
| 2003/0090007 A1 | | 5/2003 | Fischbach et al. |
| 2004/0011699 A1 | | 1/2004 | Park |

FOREIGN PATENT DOCUMENTS

| | | |
|---|---|---|
| DE | 19623826 | 12/1997 |
| EP | 0 094 869 A | 11/1983 |
| WO | WO 03/098666 A2 | 11/2003 |

* cited by examiner

*Primary Examiner*—Dao H Nguyen
*Assistant Examiner*—Tram H Nguyen
(74) *Attorney, Agent, or Firm*—Edell, Shapiro & Finnan, LLC

(57) ABSTRACT

An electronic device, including a radiofrequency power module, includes a cavity housing including a housing frame with plastic walls and with a metal frame including a top side and a rear side, a metallic housing bottom including at least one chip island, and at least one semiconductor chip. Each semiconductor chip is arranged on each chip island and includes a top side and a rear side. The plastic walls of the cavity housing are connected to the metal frame in a positively locking manner with anchoring elements, and the housing bottom is connected to the rear side of the metal frame in a thermostable manner with a solder joint.

7 Claims, 10 Drawing Sheets

ELECTRONIC DEVICE WITH SEMICONDUCTOR CHIP INCLUDING A RADIOFREQUENCY POWER MODULE

CROSS REFERENCE TO RELATED APPLICATIONS

This application is a continuation of PCT/DE2004/000185, filed, Feb. 4, 2004, and titled "Electronic Device with Semiconductor Chip, In Particular Radio Frequency Power Module, and Method for Producing the Same," which claims priority under 35 U.S.C. §119 to German Application No. DE 103 06 175.4, filed on Feb. 13, 2003, and titled "Electronic Device with Semiconductor Chip, In Particular Radio Frequency Power Module, and Method for Producing the Same," the entire contents of each are hereby incorporated by reference.

FIELD OF THE INVENTION

The invention relates to an electronic device, in particular a radiofrequency power module with a cavity housing and with at least one semiconductor chip and with a chip island on which the semiconductor chip is arranged.

BACKGROUND

Due to the high evolution of heat and the radiofrequency properties, electronic devices, in particular radiofrequency power modules, are often accommodated in cavity housings made of ceramic. It is possible to construct high-power modules that are packaged completely in a plastics composition and with a high-power semiconductor chip arranged on a chip island, at least one surface of which forms an outer wall of the housing that can be cooled by the surroundings. However, the use of such high-power modules for radiofrequency applications is limited due to the dielectric properties of the plastic housing composition into which the high-power semiconductor chips are embedded.

SUMMARY OF THE INVENTION

It is an object of the invention to provide an improved cavity housing made of plastic that does not fail even during high-temperature cycles of power devices.

In accordance with an embodiment of the present invention, an electronic device that is suitable for radiofrequency power modules comprises a cavity housing with a housing frame. The housing frame is formed from plastic walls that include, in their foot regions, a metal frame with a top side and a rear side. The metal frame can be metalized, where it is possible to form microstructures between the metal frame and the plastic of the plastic walls. An improved adhesion with a microstructure comprising anchoring elements is possible through a suitable choice of plastic and metal. A housing bottom with at least one semiconductor chip on a chip island is arranged on the metal frame that is fixedly anchored to the housing frame made of plastic. The form and size of the housing bottom is adapted to the metal frame in such a way that the housing bottom is connected to the rear side of the metal frame by a soldering joint.

In accordance with another embodiment of the invention, a method of producing an electronic device with a flat conductor frame comprises producing housing frames connected to the flat conductor frame by formation of plastic walls with central sections of flat conductors being embedded in the plastic walls and with anchoring elements of a metal frame being embedded in foot regions of the plastic walls, where the flat conductors further include inner sections that project into cavities of the housing frames. The method further comprises producing a metallic housing bottom including at least one chip island, soldering a semiconductor chip at a rear side of the semiconductor chip onto each chip island of the metallic housing bottom, fitting the metallic housing bottom to the metal frame of the housing frame via a soldering process, producing electrical connections between a top side of each semiconductor chip and the inner section of a corresponding flat conductor, and separating a housing frame from portions of the flat conductor frame to form the electronic device.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
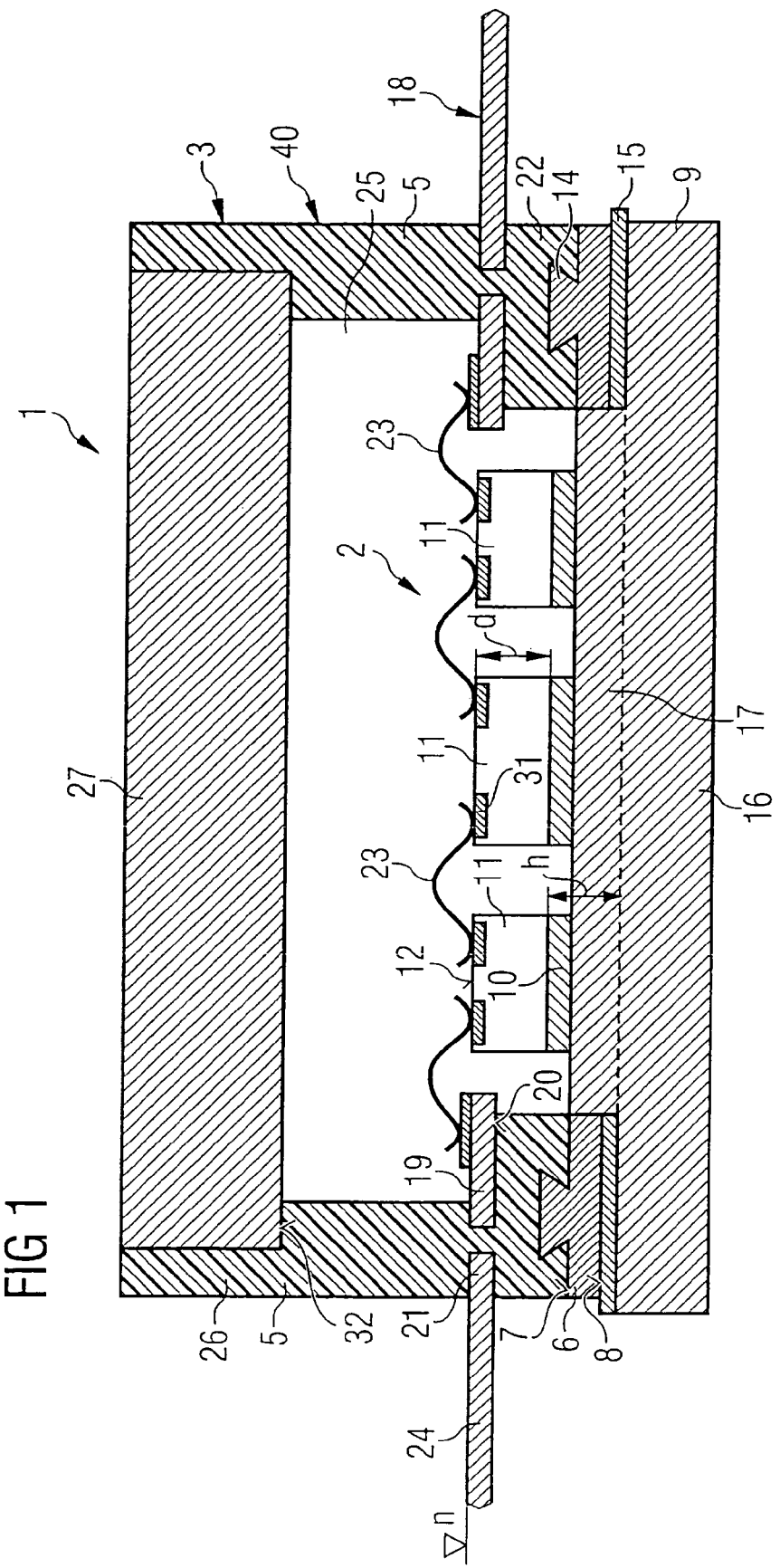
FIG. 1 depicts a diagrammatic cross section through an electronic device with a cavity housing in accordance with a first embodiment of the invention.

In accordance with the invention, an electronic device that is suitable for radiofrequency power modules includes a cavity housing with a housing frame. The housing frame is formed from plastic walls that include, in their foot regions, a metal frame with a top side and a rear side. The metal frame can be metalized, where it is possible to form microstructures between the metal frame and the plastic of the plastic walls. An improved adhesion with a microstructure comprising anchoring elements is possible through a suitable choice of plastic and metal. A housing bottom with at least one semiconductor chip on a chip island is arranged on the metal frame that is fixedly anchored to the housing frame made of plastic. The form and size of the housing bottom is adapted to the metal frame in such a way that the housing bottom is connected to the rear side of the metal frame by a soldering joint.

One advantage of this electronic device is that the metallic housing bottom does not separate from the housing frame during high-temperature loading as long as the melting point of the soldering joint is not exceeded. The solderability of the housing frame, due to the metal frame in the foot region, also facilitates the assembly of the electronic device comprising housing frame with metal frame and housing bottom with semiconductor chip. Furthermore, the reliability and the manufacturing security are increased, since the functional test of the housing bottom can be checked independently of the inspection of the housing frame made of plastic with metal frame in the foot region.

The composition of the solder in the soldering joint depends on the decomposition temperature or melting point of the joining material between semiconductor chip and chip island. The melting or softening point of the solder of the soldering joint should be at least 10° C. lower than the softening or melting point or decomposition temperature of the joining zone between the rear side of the semiconductor chip and the chip island. Thus, the semiconductor chip arranged on the housing bottom or the chip island no longer shifts during the soldering of the housing bottom to the metal frame in the foot region of the housing frame.

The upwardly open housing frame can be covered by a housing cover, the size of which is adapted to the plastic walls of the housing frame. Such a housing cover can comprise either plastic or, like the housing bottom, a metal, a metallic housing bottom and a metallic housing cover so as to provide better heat dissipation from the semiconductor chip to the surroundings.

Flat conductors can be anchored by their central sections in the plastic walls of the housing frame. While outer sections of the flat conductors project from the plastic walls, inner sections of the flat conductors project into the cavity formed by the plastic walls. Such flat conductors have the advantage that they can be connected to superordinate circuits. A connection to the top side of the semiconductor chip can be realized by bonding connections from the inner sections of the flat conductors to contact areas on the top side of the semiconductor chip, with the result that outer flat conductor connections for the supply and the signal exchange with the top side of the semiconductor chips are also available in addition to a large-area external contact for the rear side of the semiconductor chip.

The metal frame and the anchoring elements can be formed in one piece. This one-piece nature is provided both for positively locking anchoring elements that are arranged on the top side of the metal frame and are connected to the plastics composition of the plastic walls in a positively locking manner, and for anchoring elements which have, in the manner of a microstructure, a frame-type metal layer in the foot region of the plastic walls.

In a preferred embodiment of the invention, the anchoring elements can project into the plastic walls and have undercuts, where the anchoring elements taper in a direction toward the metal frame. A preferred form of the undercuts is a dovetail structure, whereby the metal frame, bearing a dovetail structure, is connected to the plastics composition of the plastic walls in a positively locking manner.

Microstructures can also form such undercuts in the microrange, dendrites made of metal or ceramic projecting into the plastic structure of the plastic walls and thus yielding an improved connection between the metal layer and the plastic compared with what can be achieved by a purely adhesive connection by an adhesive.

The anchoring elements can also project into the metal frame if the metal frame has, at least in its surface, either etching pores or etching undercuts in its volume. Moreover, openings can also be introduced into the metal frame, where the opening cross section of each of the openings decreases toward the plastic of the plastic walls. During the application of the plastics composition of the housing frame, the plastic can penetrate into the superficial pores or into the corresponding openings in the metal frame and thus ensure a positively locking connection between metal frame and plastic walls.

The housing frame can be extended in stepped fashion from bottom to top. Inner sections of the flat conductors, which are held partly by housing frame material or by the plastic of the plastic walls, can bear on a first step. The inner sections can have, as bonding areas, surfaces refined with nickel, gold, silver or alloys thereof, thereby enabling an improved bonding connection between the inner sections of the flat conductors and contact areas on the top side of the semiconductor chip. A further step can be provided in the housing frame to receive and support the housing cover.

The foot region of the housing frame, which is closed off by the metal frame, has an opening to which the housing bottom of the cavity housing is adapted. Owing to the good heat dissipation, the housing bottom has a metal, preferably made of copper or a copper alloy, which can include coatings refined with nickel, gold, silver or alloys thereof in the region of the chip island. The housing bottom can also have a metal base that projects from a metallic heat sink and is fitted into the opening of the metal frame. The metal base advantageously enables the housing bottom to be centered in the metal frame. Furthermore, it is possible to realize an accurately fitting soldering joint between the metal frame and the metallic heat sink.

The metal base can have a height h that, together with a thickness d of the at least one semiconductor chip, approximately reaches a height level n corresponding to the height level of the inner sections of the flat conductors on the lower attachment of the housing frame. This yields an advantage in that the bonding connections between inner sections of the flat conductors and contact areas of the top side of the semiconductor chip are arranged at the same level, which in turn enables short bonding wire lengths and promotes desirable radiofrequency properties.

Preferably, radiofrequency power semiconductor chips are accommodated as the semiconductor chip in such a housing since the plastics composition does not directly touch the semiconductor chips. Rather, an interspace between the semiconductor chip and the plastic walls ensures that the radiofrequency properties of the power semiconductor chips are not impaired.

Instead of an individual semiconductor chip, it is also possible for a plurality of semiconductor chips to be arranged on the housing bottom to form a radiofrequency power module. In order to transfer the power between the individual chips and the flat conductors, hundreds of bonding wires, in parallel, can connect an inner section of the flat conductors to an electrode of a semiconductor chip. Instead of such parallel bonding wires, it is possible to use flat ribbons having a thickness of 15 to 50 µm with a width of several millimeters. For fitting such connections, the cavity housing initially remains open in an upward direction in order to use the corresponding tools to produce the bonding connections.

A method for producing an electronic device with a flat conductor frame includes the following method steps. First, a housing frame is produced, which is a flat conductor frame with a plurality of device positions. During the formation of plastic walls in each of the device positions, the housing frame arises with central sections of the flat conductors of the flat conductor frame being embedded into the material of the plastic walls. At the same time, anchoring elements of a metal frame are embedded in foot regions of the plastic walls.

As an alternative, instead of a prefabricated metal frame being embedded into the plastics composition by its anchoring elements, it is possible to deposit a metal in the foot region of the plastic walls. In order to achieve corresponding microstructures between metal and plastic, which can serve as anchoring elements, either the foot region of the plastic walls is prepared accordingly in order to produce corresponding pores in the plastic, which are then filled during a deposition of a metal layer as metal frame in the foot region of the plastic walls, and an anchoring to the plastic walls is thus made possible, or the procedure is such that corresponding pores are introduced beforehand as microstructures into the top side of the metal frame, so that the latter is connected to the plastic walls by means of plastic microstructures. The method for applying a metal layer that is connected to the plastics composition of the plastic walls in a positively locking manner is also called the MIT method.

In parallel with the production of a multiplicity of housing frames on a ribbon-type flat conductor frame, a corresponding multiplicity of metallic housing bottoms are produced, each including at least one semiconductor chip. The semiconductor chip is then soldered by its rear side onto the chip island of the housing bottom, with the result that, in an advantageous manner, a functional test can be effected for each housing bottom with a semiconductor chip before its fitting to a housing frame. This also reduces the failure rate for the assembled electronic device, since only functional housing bottoms with semiconductor chips are subsequently soldered onto the metal frame of the housing frame by a soldering process.

This soldering process advantageously uses a solder which melts at lower temperatures than a joining zone between the chip island and the semiconductor chip. This ensures that the semiconductor chip no longer shifts with respect to the position on the housing bottom during the process of soldering the housing bottom to the housing frame.

After the housing bottom has been soldered in, electrical connections are produced between the top side of the semiconductor chip and inner sections of the flat conductors. For power devices, it is possible to bond hundreds of bonding wires on an inner section of a flat conductor to a contact area on the top side of the semiconductor chip. Instead of hundreds of bonding wires, it is also possible to bond flat ribbons between the inner sections of the flat conductors and the contact areas on the top side of the semiconductor chip. The cavity housings for electronic devices, which have arisen as a result of the fitting of the housing bottoms, are additionally connected to one another by the flat conductor frame and, in a final method step, are separated to form individual electronic devices out of the flat conductor frame. This separation process can be effected by stamping-out.

For production of the housing frame, the flat conductors of the flat conductor frame are arranged in one plane, and a downwardly and upwardly open housing frame can be fitted in each of the device positions by a procedure in which central sections of the flat conductors are embedded into the housing frame, while outer sections of the flat conductors project from the housing frame and inner sections of the flat conductors project into a cavity of the housing frame. Such inner sections of the flat conductors may already be provided with a bondable coating during the production of the flat conductor frame by a procedure in which a metal, such as nickel, gold, silver or alloys thereof, is sputtered or vapor-deposited onto the inner sections of the flat conductors of the flat conductor frame. These methods have the advantage that they yield perfect coatings, on the one hand, and are suitable for mass production, on the other hand.

The fitting of the housing frame, with central sections of the flat conductors being embedded, can be achieved by injection-molding of a plastics composition into an injection mold adapted to this flat conductor frame, with the central sections of the flat conductors being embedded into the plastic housing composition. At the same time as the embedding of the inner sections of the flat conductors, it is possible to achieve the anchoring elements of the metal frame into the plastic housing composition in each device position if a correspondingly prepared metal frame is equipped with emplaced anchoring elements or with etched-in anchoring openings.

As an alternative, the metal frame may be achieved by coating the finished housing frame with a metal, with the foot region of the plastic walls being prepared in such a way that, during an electrodeposition or chemical deposition of the metal frame on the plastic walls, microstructures simultaneously arise that mesh closely with the plastics composition. For this purpose, preferably micropores are produced into the plastics composition in the foot region of the plastic walls, which are subsequently filled with the metal coating by electrodeposition or chemical deposition.

To produce the housing bottom, a metal plate, for example made of copper or a copper alloy, is first adapted to the opening of the metal frame. The metal plate is provided with a base that can be introduced into the opening of the metal frame in an accurately fitting manner. Before the housing bottom is fit to the housing frame, chip islands are provided on the base by application of gold or aluminum coatings to the metal base. The semiconductor chips are fit by their rear sides to the chip islands and the housing bottom with semiconductor chips can subsequently be tested in order to ensure that no housing bottoms are incorporated that have either incorrect semiconductor chips or incorrectly oriented semiconductor chips or other defects.

After the defective housing bottoms have been sorted out, the functional housing bottoms with the semiconductor chips are soldered to the metal frame of the metal walls in the foot region. Since the housing frame is accessible from above, it is then possible to connect the inner sections of the flat conductors to electrodes of the semiconductor chip. A multiple parallel bonding of hundreds of bonding wires or a fitting of flat ribbons between an inner section of a flat conductor and an electrode of the semiconductor chip or between electrodes of a plurality of semiconductor chips is carried out in this case.

The construction can still be tested before the cavity housing is sealed with a housing cover made of plastic or metal. Finally, after the separation of the flat conductor frame in each of the device positions to form individual electronic devices, the device is subjected to functional tests during extreme temperature cycles (e.g., between 50° C. and 150° C.). The conforming fitting of a metal frame with soldering joint to the housing bottom of the invention provides an increased yield of functionally tested electronic devices.

Exemplary embodiments of the electronic device of the invention are described below with reference to FIGS. 1-12.

FIG. 1 depicts a diagrammatic cross section through an electronic device 1 with a cavity housing 3 in accordance with a first embodiment of the invention. The cavity housing 3 has an upwardly and downwardly open housing frame. A cavity enclosed by the housing frame is surrounded by plastic walls 5, a metal frame 6 being arranged in a foot region of the plastic walls 5, where a top side 7 of the metal frame adjoins the foot region 22 of the housing frame.

The cavity housing 3 is closed off at a lower or downward location by a metallic housing bottom 9 which is formed as a heat sink 16 in this embodiment. The housing bottom 9 is connected to the rear side 8 of the metal frame 6 by a soldering joint 15. The metal frame 6 includes anchoring elements 14, which have a dovetail configuration in this first embodiment of the invention, with the result that there is a positively locking anchoring of the metal frame 6 in the foot region 22 of the plastic walls 5.

Flat conductors 18, which are simultaneously embedded with the anchoring elements 14 in the plastic walls 5, each include an outer section 24, a central section 21 embedded in the plastic, and an inner section 19 arranged on a stepped attachment 20 of the plastic walls 5. In this embodiment of the invention, three chip islands 10 are arranged on the housing bottom 9. The chip islands include a gold coating, while the housing bottom 9 is produced from a copper alloy. The silicon of the semiconductor chips 11 forms a eutectic alloy with the gold coating of the chip islands 10 in the course of application at correspondingly high temperatures, so that the semiconductor chips 11 are securely connected to the housing bottom 9 and remain fixed on the chip islands 10 during the soldering of the housing bottom 9 to the metal frame 6.

The anchoring elements 14 are shaped as undercuts (where the anchoring elements taper in a direction toward the metal frame) to ensure that the metal frame 6 does not detach from the plastic walls 5 during the soldering of the housing bottom 9 to the metal frame 6. Even in the event of high temperature loading on this radiofrequency power module 2, such a positively locking anchoring to the plastic walls 5 withstands the loading, so that such a radiofrequency power module 2 in accordance with the first embodiment has an improved service life.

The connection of the flat conductors 18 to contact areas 31 on active top sides 12 of the semiconductor chips 11 is achieved by hundreds of parallel-connected bonding wires or electrical connections 23, which connect between the inner sections 19 of the flat conductors 18 and contact areas 31 and also between contact areas 31 of adjacent semiconductor chips 11. The electrical connections 23 are bonded flat conductor ribbons.

In order to enable bonding at as far as possible the same level n, the housing bottom 9 has a metal base 17, which has, together with the thickness of the chip island 10, a height h dimensioned such that the thickness d of the semiconductor chips 11 plus the height h of the base 17 reaches the level n of the flat conductors 18 within the electronic device. In other words, the thickness dimensions of each of the metal base 17, each chip island 10 and each semiconductor chip 11 are selected such that a top surface of each semiconductor chip 11 is substantially planar with the top surfaces of inner sections 19 of the flat conductors 18. It is thus possible to provide the electrical connections 23 in a single bonding plane.

The electronic device 1 with the radiofrequency power module 2 in the cavity 25 is closed off upwardly by a housing cover 27, which, in this embodiment of the invention, is formed from a copper or nickel alloy and engages with a second attachment of the housing frame 40. The combination of metallic housing bottom 9 and of metallic housing cover 27 shields the radiofrequency power module 2 (disposed therebetween within cavity 25) from external stray electric fields.

Figure 2:
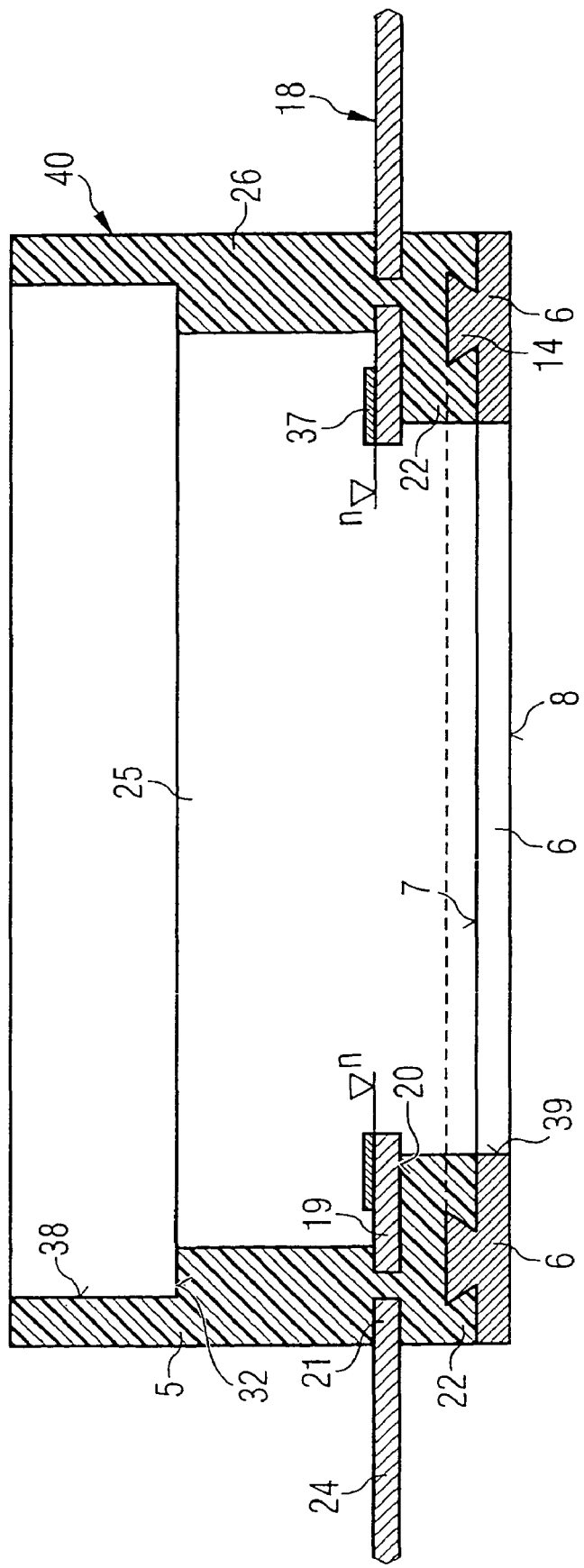
FIG. 2 depicts a diagrammatic cross section through a housing frame of FIG. 1.

FIG. 2 depicts a diagrammatic cross section through the housing frame 40 of FIG. 1. Housing frame 40 includes plastic walls 5. The metal frame 6 arranged in the foot region 22 of the plastic walls 5 is produced from a copper plate that leaves an opening 39 free in the foot region of the housing frame 40, such that it is possible to fit the housing bottom with its metallic base into the opening. Such a housing frame 40 can be realized independent of the production and preparation of the housing bottom by a procedure in which first a suitable metal frame 6 is produced from a copper plate. The undercuts can be produced by milling, thereby effecting a secure anchoring during the injection-molding of the plastic walls 5 of the housing frame 40.

Figure 3:
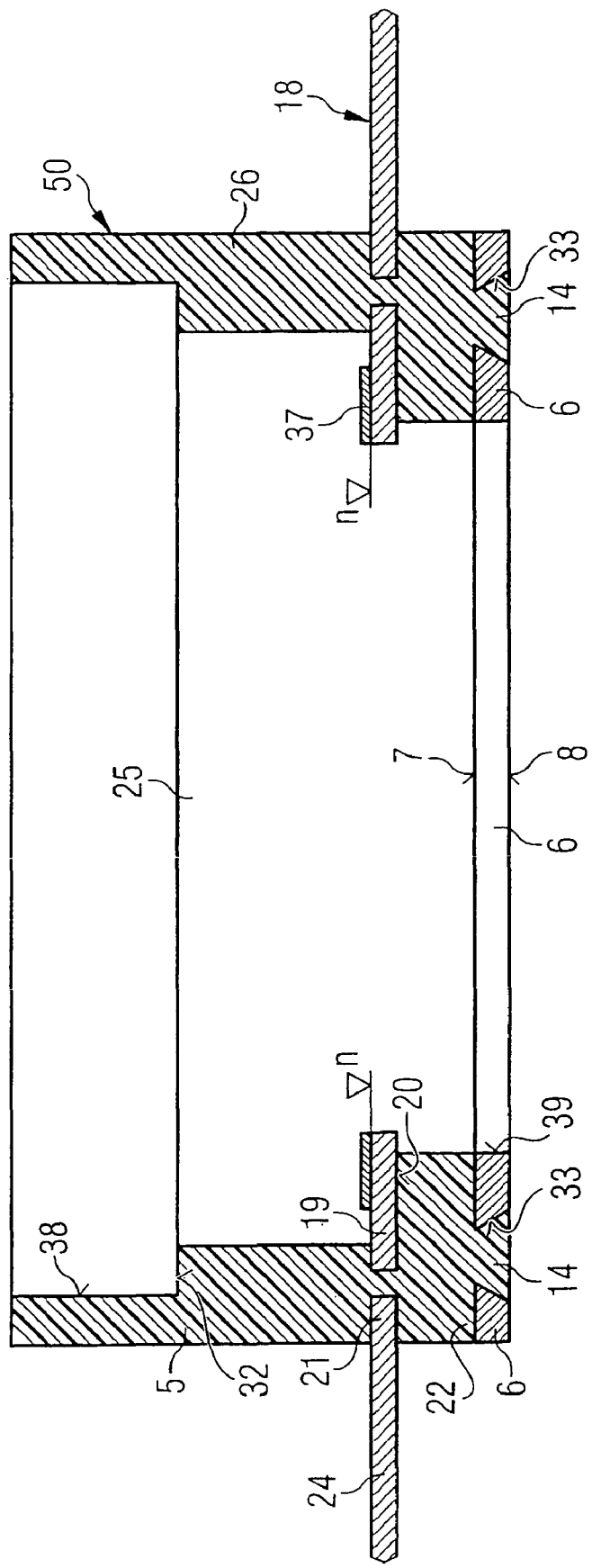
FIG. 3 depicts a diagrammatic cross section through a housing frame for an electronic device in accordance with a second embodiment of the invention.

FIG. 3 depicts a diagrammatic cross section through a housing frame 50 for an electronic device of a second embodiment of the invention. In this case, the anchoring of the plastic walls 5 to the metal frame 6 is not achieved by anchoring elements made of metal, but rather by anchoring elements made of plastic which are part of the plastic walls. Corresponding openings 33 are made in metal frame 6 before the metal frame is connected to plastic walls 5. The openings 33 have a cross section that tapers in the direction of the plastic walls 5, thereby enabling a positively locking anchoring by filling the openings 33 with plastic housing composition 26.

Figure 4:
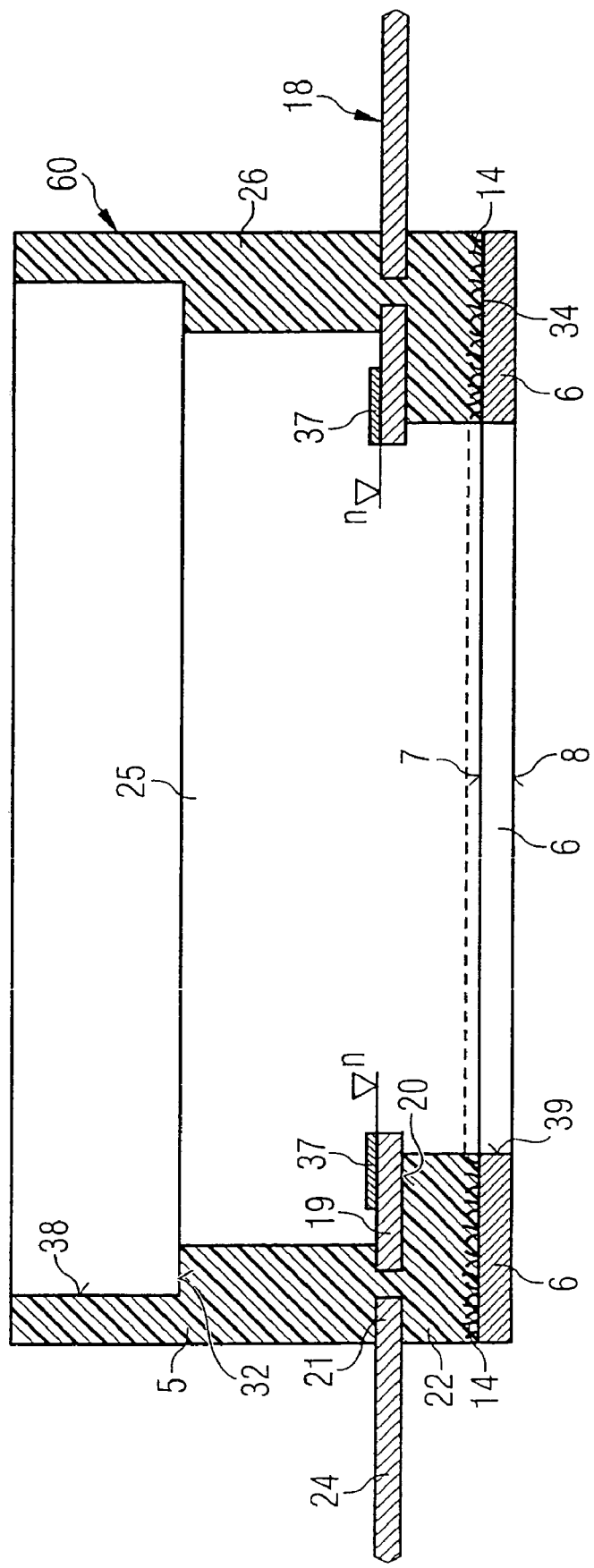
FIG. 4 depicts a diagrammatic cross section through a housing frame for an electronic device in accordance with a third embodiment of the invention.

FIG. 4 depicts a diagrammatic cross section through a housing frame 60 for an electronic device in accordance with a third embodiment of the invention. In this embodiment of the invention, the metal frame 6 is realized by a metal coating 34, open pores firstly being produced in the foot region 20 of the plastic walls 5, which pores fill with metallic anchoring elements 14 during the deposition of the metal layer to form a metal frame 6 and consequently form a positively locking anchoring between metal coating 34 and foot region 22 of the plastic walls 5. Although not shown, a further possibility includes providing the surface of a metal frame 6 with metallic or ceramic dendrites and then applying the plastic walls 5.

Figure 5:
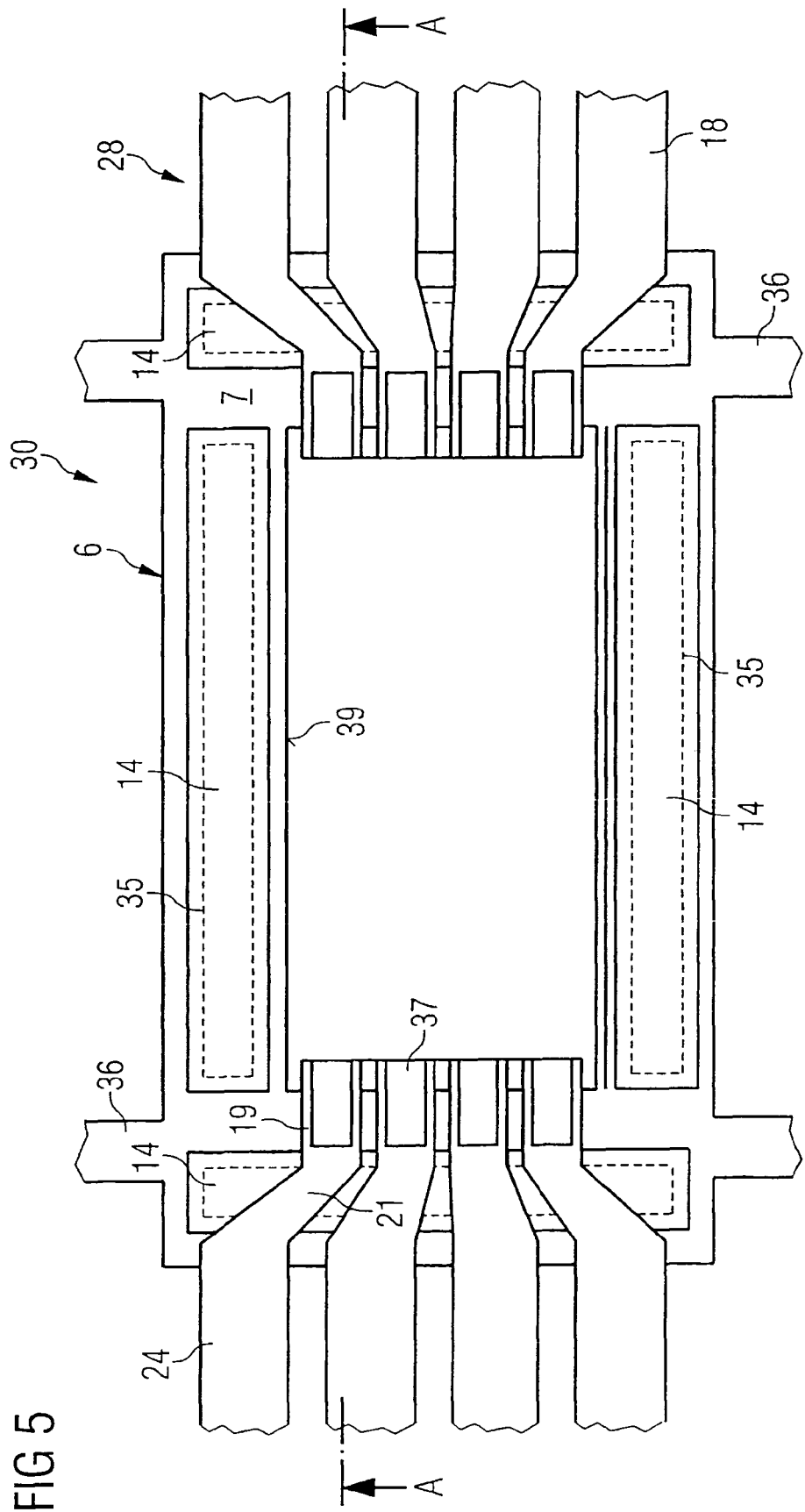
FIG. 5 depicts a diagrammatic plan view of a device position portion of a flat conductor frame and a metal frame arranged underneath for the housing frame of FIG. 2.

FIG. 5 depicts a diagrammatic plan view of a detail from a device position 30 of a flat conductor frame, of which, however, only the flat conductors 18 are represented. Oriented underneath is a metal frame 6 for a housing frame in accordance with FIG. 2. The anchoring elements 14 in dovetail form are arranged on the four sides of the metal frame 6, undercuts 35 being indicated by dashed lines. Furthermore, the metal frame 6 of this embodiment of the invention has four lugs 36, which serve for the fixing and orientation of the metal frame 6 and can be connected to the flat conductor frame 28. The lugs 36 can be removed after the completion of the electronic device.

The inner sections 19 of the flat conductors 18 are coated with contact pads 37. This coating has a noble metal such as gold or silver or else aluminum in order to facilitate bonding from said contact pads 37.

Figure 6:
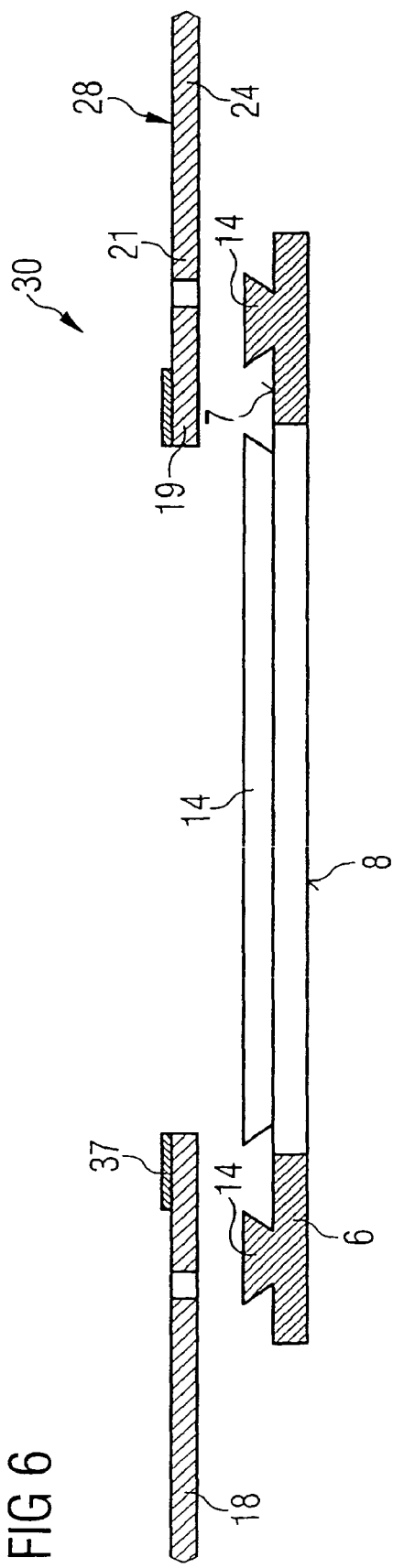
FIG. 6 depicts a diagrammatic cross section through the flat conductor frame along the section line A-A in FIG. 5.

FIG. 6 depicts a diagrammatic cross section through a flat conductor frame along the section line A-A in FIG. 5. In this first embodiment of the invention, the anchoring elements 14 and the metal frame 6 form a one-piece component which are oriented below the flat conductors 18 of the flat conductor frame 28 before production.

FIGS. 7 to 12 show cross sections through components of the electronic device after carrying out individual production steps to form the electronic device of FIG. 1.

Figure 7:
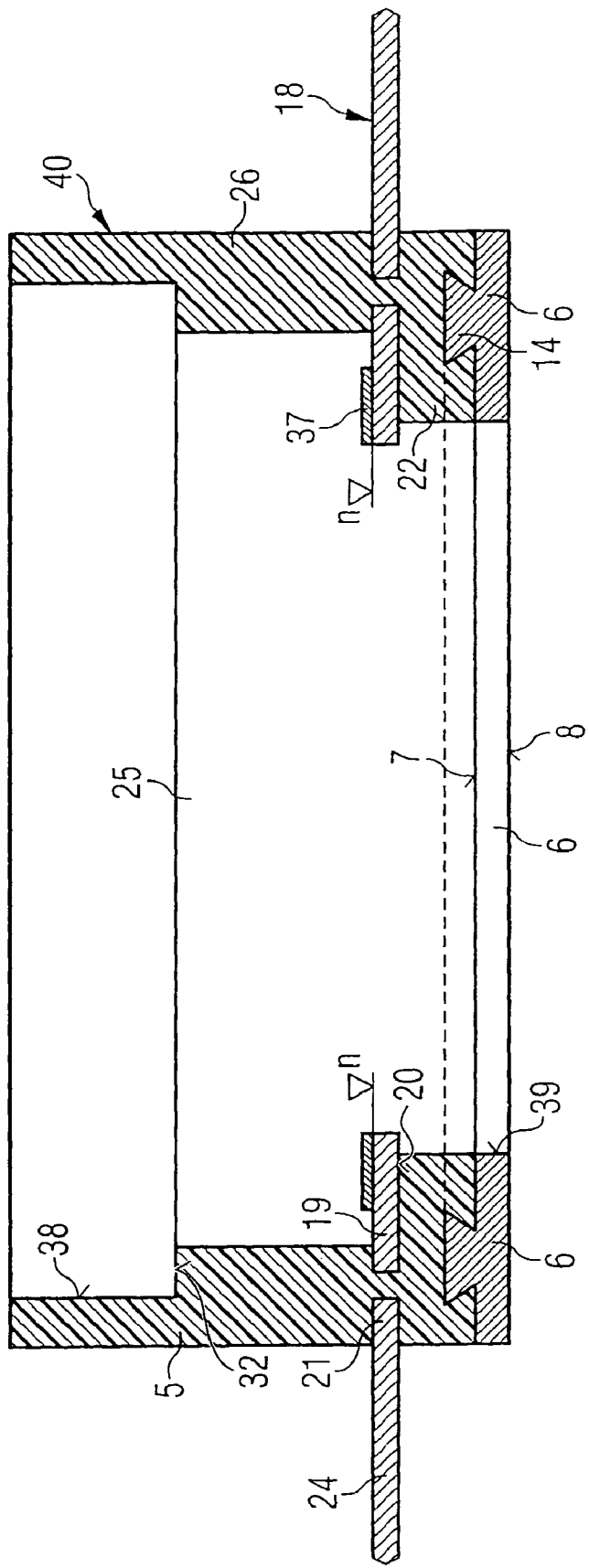
FIGS. 7-12 show cross sections through components that show the individual production steps to form the electronic device of FIG. 1.

FIG. 7 depicts the finished housing frame 40 as can already be seen in FIG. 2. By injection-molding or die-casting of a plastic housing composition 26 into an injection mold, the components shown in FIGS. 5 and 6 are connected to one another to form a housing frame 40 in a single injection molding operation. The cavity 25 of the housing frame 40 is extended in stepped fashion from bottom to top, that is to say from the envisaged housing bottom to the envisaged housing cover. The inner sections 19 of the flat conductors 18 which project into the cavity 25 of the housing frame 40 are arranged on the first shoulder or the first step in order to form a support for bonding on the contact pads 37. A second stepped attachment 32 is produced by the injection operation of the plastic walls 5. A housing cover can be made to engage with the housing walls 5.

Figure 8:
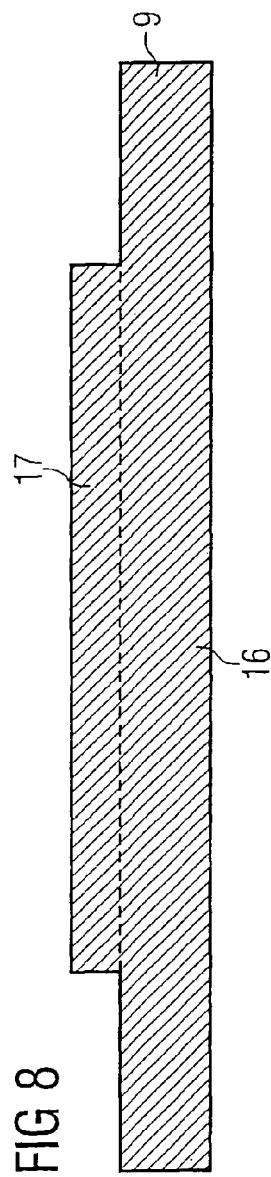
Figure 9:
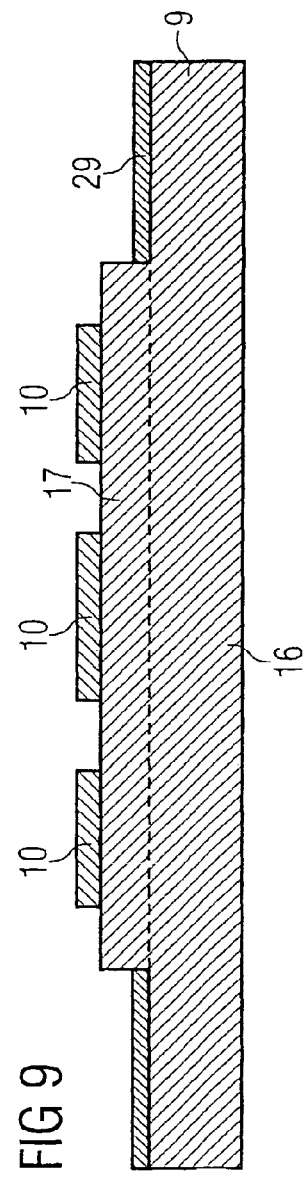
Figure 10:
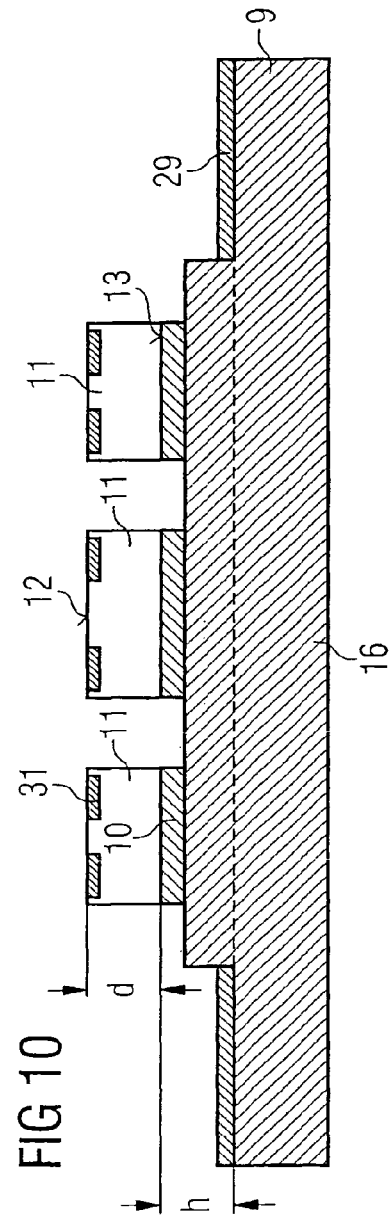

The metallic housing bottom 9 can be prepared and equipped with semiconductor chips 11 independently of the production of the housing frame 40 as is shown in FIG. 7. This is shown in FIGS. 8 to 10. In particular, FIG. 8 depicts a cross section through the housing bottom 9 including a base 17 adapted to fit within the opening 39 of the housing frame 40 as shown in FIG. 7. Three chip islands 10 made of a gold alloy are deposited onto the base 17, where the gold alloy reacts with the silicon of the semiconductor chips and enters into a eutectic alloy that has a higher melting point than a soldering material.

Such a soldering material is applied as solder layer 29 after the application of the coating for the chip islands 10 to the housing bottom 9 in the regions which are intended to be connected to the metal frame of the housing frame 40 shown in FIG. 7 by a soldering process. After the preparation of the housing bottom 9 of FIG. 9, semiconductor chips 11 are alloyed on the chip islands 10 at a eutectic temperature as depicted in FIG. 10. This composite between housing bottom 9 and semiconductor chips 11 is likewise subjected to functional testing independently of a function test of the housing frame shown in FIG. 7, with the result that only tested components are assembled to form an electronic device.

Figure 11:
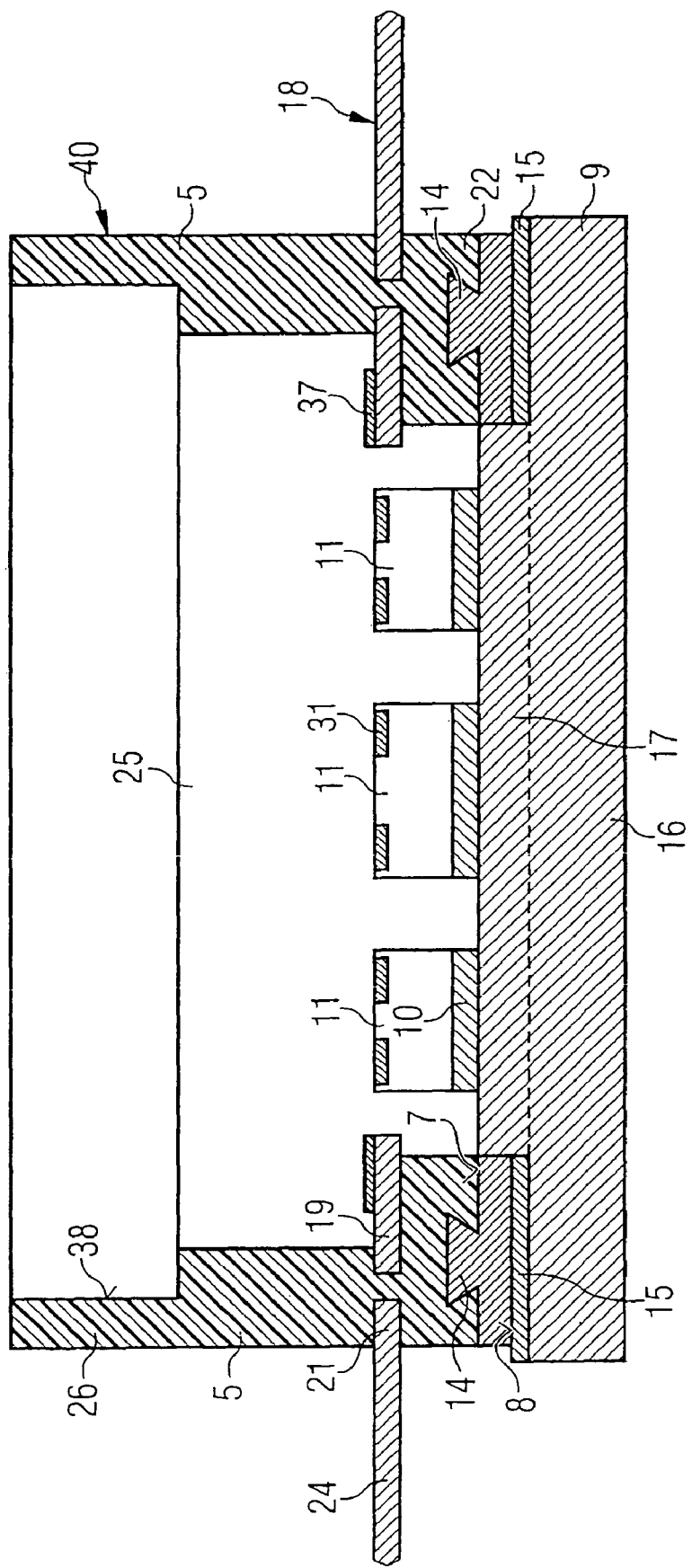

FIG. 11 depicts the housing frame 40 after the housing bottom 9 has been soldered on and the solder joint 15 has been formed. A functional device is not yet present after this production step, since the electrical connections between the inner sections 19 of the flat conductors 18 and the contact areas 31 of the semiconductor chips 11 and also electrical connections of contact areas of the semiconductor chips 11 among one another are missing. Since FIG. 11 shows that the housing frame 40 with soldered-on housing bottom 9 is open at an upward or top portion, the missing electrical connections 23 are produced through an upper opening 38 of the housing frame 40, as can be seen in FIG. 12.

Figure 12:
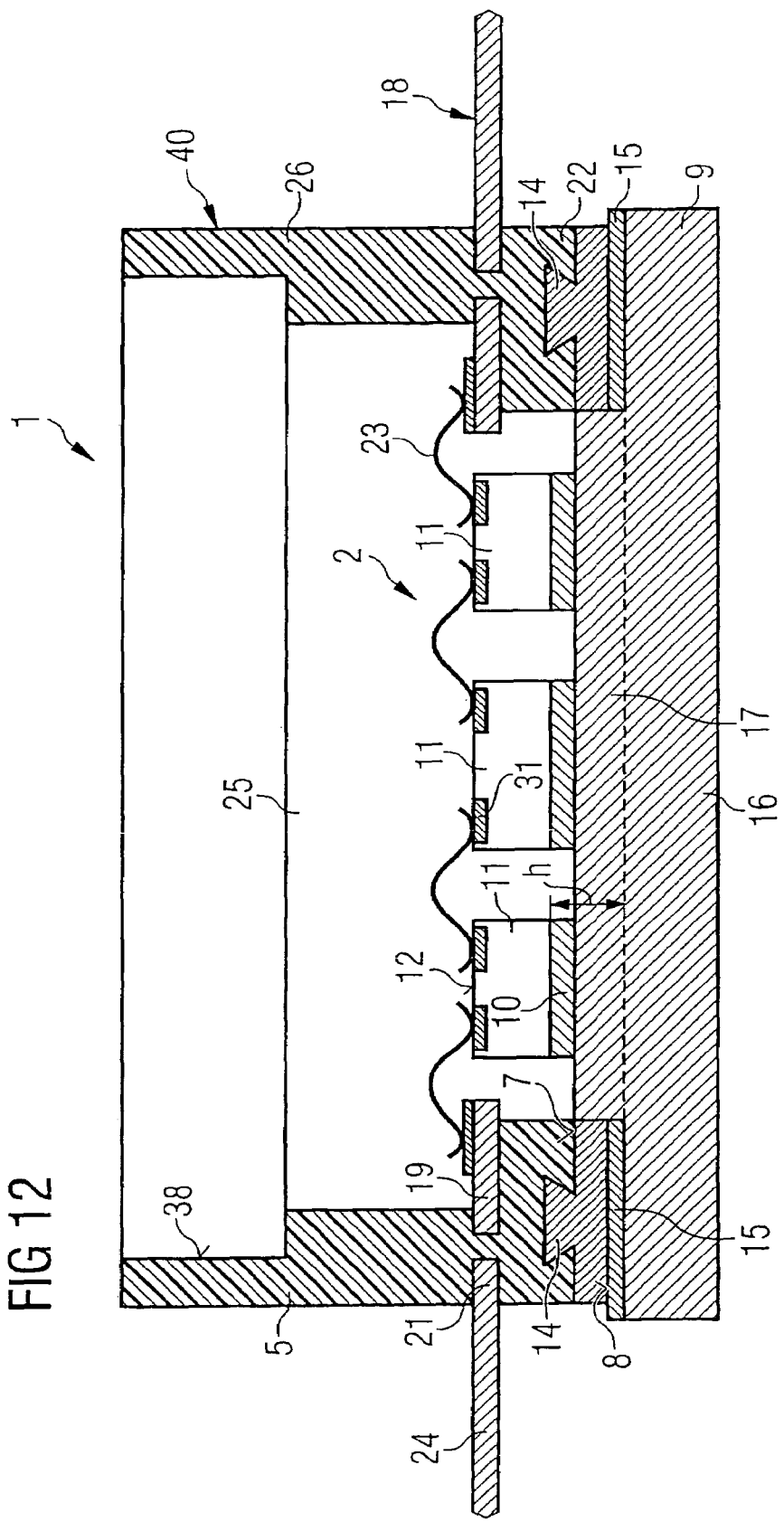

FIG. 12 depicts an electronic device 1 as depicted in FIG. 1, with the exception that the housing cover 27 has not yet been added to the device. The housing cover is added in a final step, thereby producing an electronic device 1 as shown in FIG. 1.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. An electronic device including a radiofrequency power module, the electronic device comprising:
   a cavity housing including a housing frame with plastic walls and with a metal frame including a top side and a rear side;
   a metallic housing bottom including at least one chip island; and
   at least one chip, each chip being arranged on each chip island and including a top side and a rear side;
   wherein the plastic walls of the cavity housing are connected to the metal frame with anchoring elements, and the housing bottom is connected to the rear side of the metal frame with a solder joint.

2. The electronic device of claim 1, wherein the anchoring elements are formed as part of the metal frame.

3. The electronic device of claim 1, wherein the anchoring elements project into the plastic walls and comprise undercuts.

4. The electronic device of claim 1, wherein the anchoring elements project into the metal frame.

5. The electronic device of claim 1, wherein the metallic housing bottom comprises a metallic heat sink soldered onto the metal frame.

6. The electronic device of claim 1, wherein the metallic housing bottom comprises a metal base that projects from a metallic heat sink and is fit into the metal frame.

7. The electronic device of claim 6, further comprising:
   flat conductors including inner sections that project into the cavity housing;
   wherein each chip island is connected to the metal base, and the thickness dimensions of each of the metal base, each chip island and each chip are selected such that a top surface of each chip is substantially planar with the top surfaces of the inner sections of the flat conductors.

* * * * *